United States Patent [19]

Cornell et al.

[11] Patent Number: 4,721,868
[45] Date of Patent: Jan. 26, 1988

[54] IC INPUT CIRCUITRY PROGRAMMABLE FOR REALIZING MULTIPLE FUNCTIONS FROM A SINGLE INPUT

[75] Inventors: Barry S. Cornell, Santa Clara; M. Clifford Biggers, San Jose, both of Calif.

[73] Assignee: Advanced Micro Devices, Inc., Sunnyvale, Calif.

[21] Appl. No.: 910,595

[22] Filed: Sep. 23, 1986

[51] Int. Cl.⁴ .............................................. H03K 17/94
[52] U.S. Cl. ................................... 307/465; 307/202.1;
       307/449; 307/463; 307/243; 364/716
[58] Field of Search ............... 307/202.1, 443, 446,
       307/449, 463, 242, 243, 572, 465–469, 579, 584,
       585; 364/716; 340/825.83, 828.84, 825.91

[56] References Cited

U.S. PATENT DOCUMENTS

| | | | |
|---|---|---|---|
| 4,084,105 | 4/1978 | Teranishi et al. | 307/242 X |
| 4,207,556 | 6/1980 | Sugiyama et al. | 364/716 X |
| 4,240,094 | 12/1980 | Mader | 307/465 X |
| 4,286,173 | 8/1981 | Oka et al. | 307/242 X |
| 4,409,683 | 10/1983 | Woodward | 307/243 X |
| 4,486,880 | 12/1984 | Jeffery et al. | 307/243 X |
| 4,577,124 | 3/1986 | Koike | 307/243 X |
| 4,600,846 | 7/1986 | Burrows | 307/202.1 X |
| 4,645,944 | 2/1987 | Uya | 307/243 |

Primary Examiner—Stanley D. Miller
Assistant Examiner—D. R. Hudspeth
Attorney, Agent, or Firm—Patrick T. King; John P. Taylor

[57] ABSTRACT

A single, programmable, multifunctional input circuit scheme for integrated circuit chips is disclosed. An input pin is provided with selectable input logic circuit blocks, each capable of providing an input signal to another circuit in the integrated circuit system architecture. The user of the chip is provided with means for programming said pin to select one of said logic circuit blocks, whereby each said pin has multifunction capability.

15 Claims, 6 Drawing Figures

| $Q_0$ | $Q_1$ | $Q_2/F_2$ | $Q_3/F_1$ | HEX | PIN 4 INPUT |
|---|---|---|---|---|---|
| NO FUSE | NO FUSE | 0 | 0 | 0 | ASYNCHRONOUS ENABLE = $\overline{E}$ |
| ↓ | ↓ | 1 | 0 | 8 | SYNCHRONOUS ENABLE = $\overline{E_S}$ |
| ↓ | ↓ | 0 | 1 | 4 | ASYNCHRONOUS INITIALIZE = $\overline{INIT}$ |
|  |  | 1 | 1 | C | SYNCHRONOUS INITIALIZE = $\overline{INIT_S}$ |

4,721,868

IC INPUT CIRCUITRY PROGRAMMABLE FOR REALIZING MULTIPLE FUNCTIONS FROM A SINGLE INPUT

BACKGROUND OF THE INVENTION

1. Field of the Invention

The present invention generally relates to integrated circuit devices and, more particularly, to a single, multi-functional, integrated circuit input scheme which is user-programmable.

2. Description of the Related Art

Integrated circuit (IC) miniaturization has progressed to the stage where, in very large scale integration (VLSI) technologies, there are in excess of a million devices on an integrated chip which is typically 0.3 to 0.5 square inch in surface area.

While functional density and capability at the IC level has increased dramatically, one limitation on the flexibility of IC use has remained the number of input and output pins available on the chip carrier package. The circuit designer is limited as to the functions which the device can perform by the number of input control signals and output signals that will be available based on the design of the carrier package. Examples of typical dual-inline package input/output requirements for several programmable read only memory (PROM) ICs are shown in FIG. 1.

One solution is to use packages with more pins. Pin grid array packages, such as shown in FIG. 2, provide a higher input/output capability. However, this solution is at the expense of miniaturization and problems such as chip-to-chip interconnect distances and pin-to-socket alignment difficulties. While suitable for chips such as programmable logic arrays (PLA) used, for example, as simple state-machines, such packaging would be unacceptable for higher logic devices such as memory chips used in compact, powerful, high-speed computers.

Another solution has been to provide the user with the option to implement a variety of input functionalities through fabrication process modification. Typically, separate metallization masks are used to alter the interconnect pattern of the completed integrated circuit. This, of course, is a customization during fabrication which cannot be altered thereafter.

A simple "programmability" solution has been to provide the user with an "either/or" choice for a particular pin. For example, the devices of FIG. 1, manufactured by the current assignee, Advanced Micro Device, Inc., Sunnyvale, Calif., can have a programmable output enable pin and/or a programmable register initialize pin. The unprogrammed state of these pins is asynchronous operation. Should the system in which they are used require, either function may be changed to a synchronous mode of operation by programming an architecture word. For example, the initialize function uses a programmable word which is loaded into the output data registers to change the device to synchronous operation. This is a very limited, narrow application solution to the problem at hand.

Hence, there is a need for increasing the flexibility of the available pins of an IC package.

SUMMARY OF THE INVENTION

It is an object of the present invention to provide a scheme for programming a single input of an integrated circuit to a variety of functions.

It is another object of the present invention to provide user-programmable circuitry for an integrated circuit input pin.

It is yet another object of the present invention to increase the flexibility of integrated circuit devices having a fixed number of input terminals by providing a programmability scheme for each input terminal.

In a broad aspect, the present invention comprises a programmable input circuit having a plurality of input circuits for providing a variety of output signals, and means for selecting one of said plurality of input circuits.

Other objects, features and advantages of the present invention will become apparent upon consideration of the following detailed description and the accompanying drawings, in which like reference designations represent like features throughout the FIGURES.

The drawings referred to in this description should be understood as not being drawn to scale except if specifically noted. Moreover, the drawings are intended to illustrate only one portion of an integrated circuit fabricated in accordance with the present invention.

DETAILED DESCRIPTION OF THE INVENTION

Reference is made now, in detail, to a specific embodiment of the present invention which illustrates the best mode presently contemplated by the inventors for practicing the invention. Alternative embodiments are also briefly described as applicable.

Figure 1:
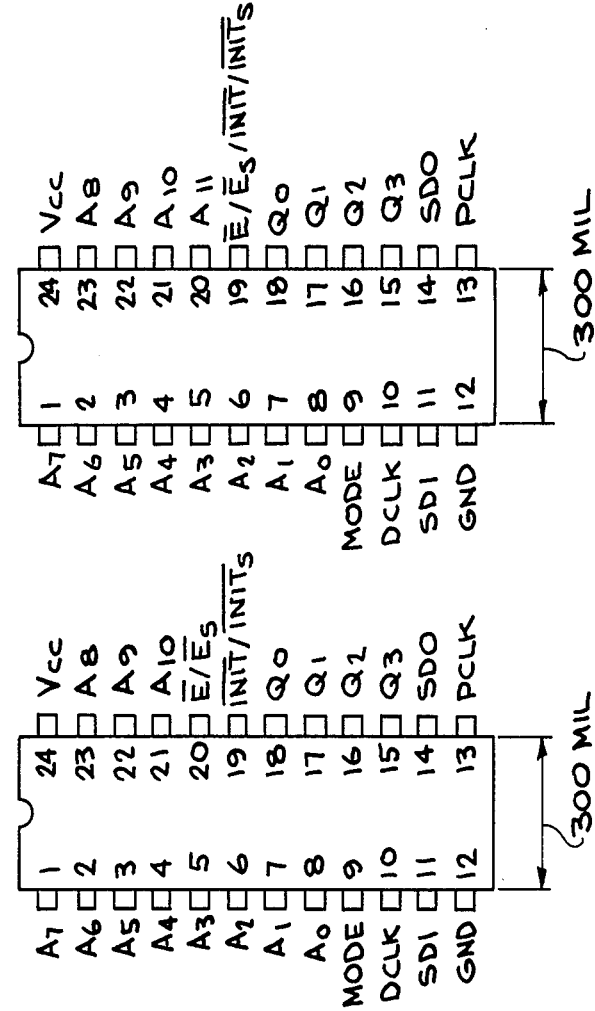
FIG. 1 (prior art) is a depiction of typical pin arrangements for dual-in-line type IC carrier packages.
Figure 2:
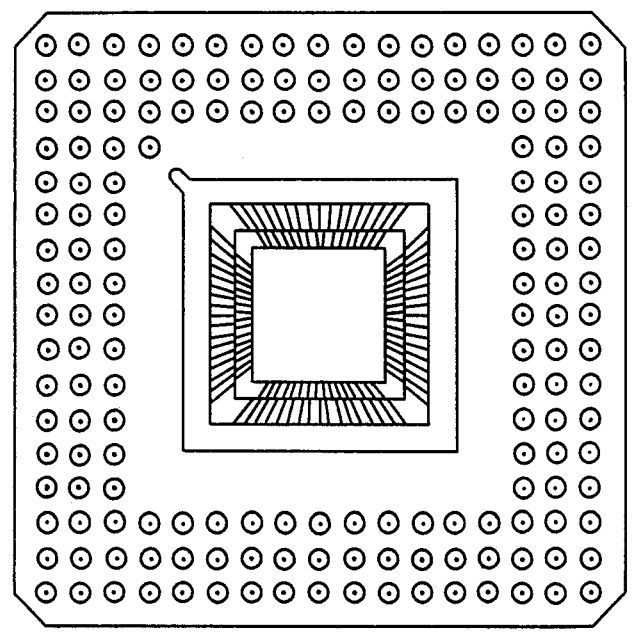
FIG. 2 (prior art) is a depiction of a typical pin arrangement for a grid array type IC carrier package.
Figure 3:
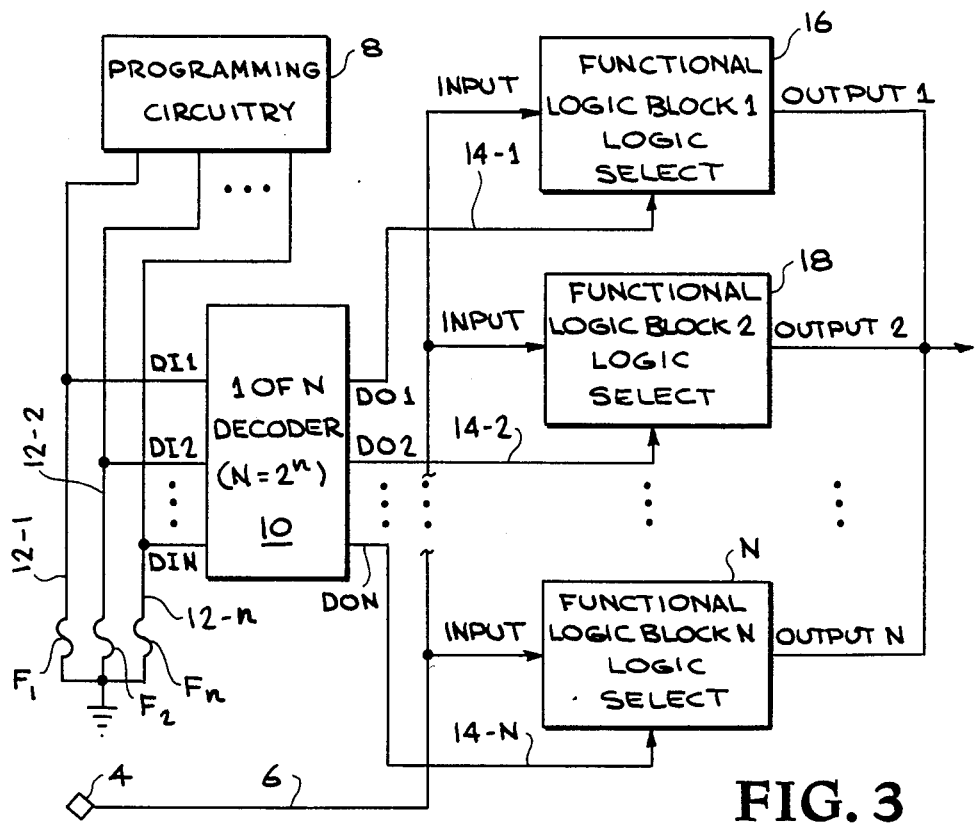
FIG. 3 is a schematic drawing of the general logic block diagram of the system architecture of the preferred embodiment of the present invention.

Referring now to FIG. 3, the present invention is shown in generalized logic block diagram form. A chip input pin 4 is coupled via interconnect line 6 to one input terminal of each of a plurality of functional logic circuitry blocks #1–#N. Each block #1–#N (also marked 16, 18 . . . N On FIG. 3) is a circuit which generates an output signal at an output terminal. The output signal is transmitted via respective output interconnect lines #1'–#N' to another circuit (not shown) on the same integrated circuit chip.

In other words, a particular signal from one of said blocks 16, 18 . . . N is transmitted to the main functional sections of the chip, such as programmable read only memory (PROM) or programmable logic array (PLA) circuits.

A signal supplied on input pin 4 would be a form of user-supplied "enable-type" signal to initiate the operation of the blocks #1–#N to generate said output signal to said chip circuit via interconnect lines #1'–#N'.

In order to determine which of the logic blocks #1–#N is operational, each block has a second input terminal for receiving a signal level which will effectively "select" that block #1–#N over any other block.

In this embodiment, the input pin is "programmed" such that only one of the blocks #1–#N output signals is actually generated on output line #1'–#N', respectively, when the enabling-type signal is applied to input pin 4 and, hence, to the block #1–#N first input terminals.

In order to perform said programming of each input pin 4 which is coupled to such selectable logic block #1–#N, on-chip circuitry 8 is provided for programming the means for selecting which block #1–#N receives said selecting signal.

Figure 4:
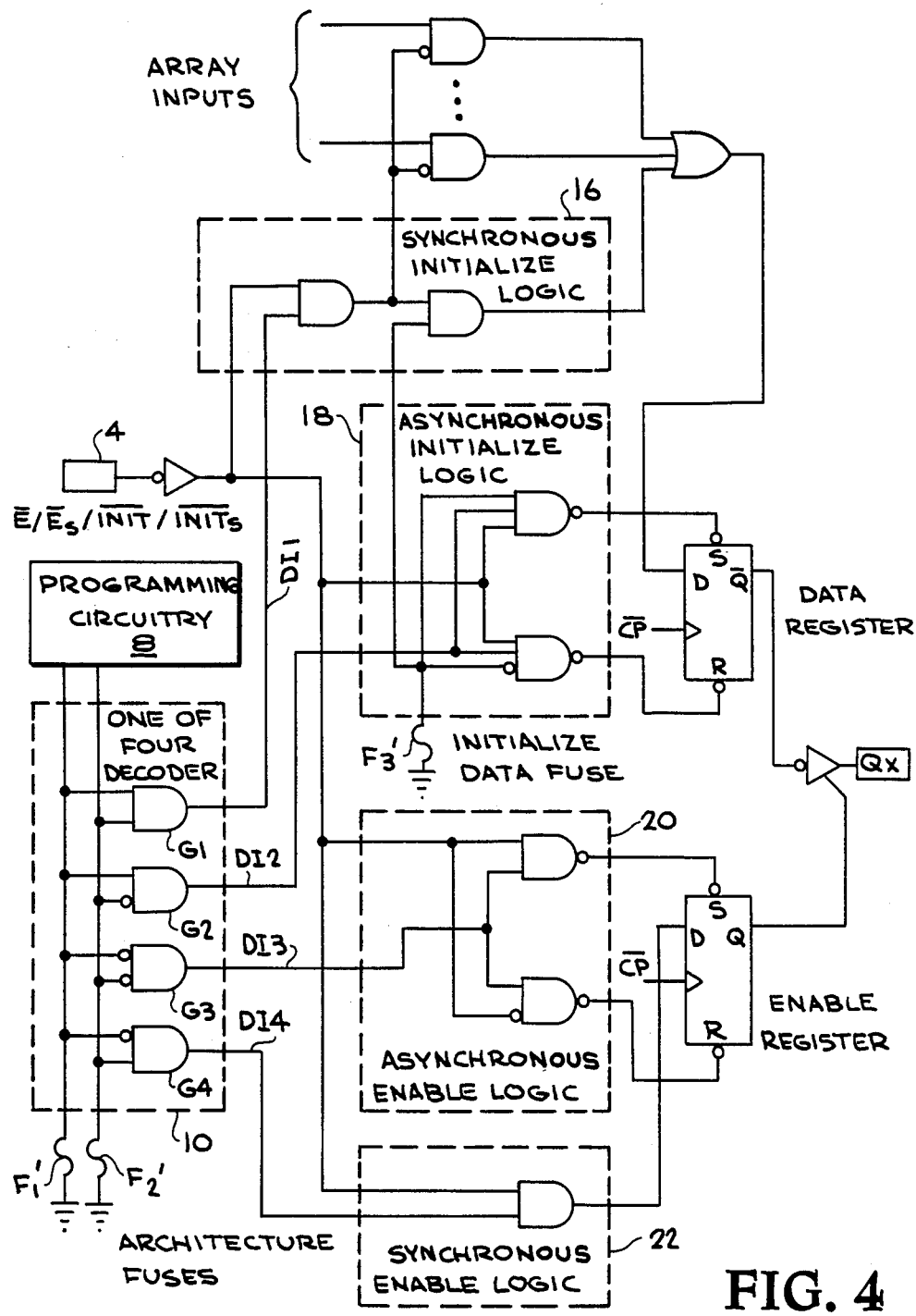
FIG. 4 is a schematic circuit logic diagram of an exemplary implementation of the present invention as shown in FIG. 3.

In the embodiment shown in FIGS. 3 and 4, the programming circuitry 8 is used to sever on-chip fuses F1–Fn, the state of which will determine which block #1–#N receives the selecting signal level. This programming circuitry 8 can be on or off the IC. (Note: the same programming circuitry 8 can also serve to program other programmable sections of the chip, such as the PROM or PLA. Such circuitry and commercial devices for performing such programming are well known in the art and, therefore, no detailed description is presented here.) As will be recognized by a person skilled in the art, the fuses can also be selectively severed by other means, such as a laser adapted for this purpose.

In the present embodiment, each fuse F1–Fn is a coupling between a reference potential level, such as circuit ground, and discrete input terminals DI1 - DIN of a decoder circuit 10 via interconnect lines 12-1 through 12-n. The decoder 10 is the hardware implementation of a truth table which effectively reads the state of the fuses F1–Fn based upon the signal level at the decoder inputs DI1–DIN.

Each decoder output terminal DO1–DON is discretely coupled via interconnect lines 14-1 through 14-N to said second input terminals of said blocks #1–#N, respectively. Hence, once programmed, e.g., once the appropriate fuses F1–Fn are severed in order to couple one respective decoder input to the reference potential, the respective block FX coupled to said reference potential through the decoder 10 will have an active input signal on said second input and be in a "selected" state. In the example, "selected" block—and only the selected block—will be ready to generate its output signal whenever enabled by the appropriate input signal on pin 4.

In this manner, i.e., by blowing the appropriate fuses, the user programs the input pin 4 such that the desired available blocks #1–#N generate an output signal to the chip.

Note, particularly, that to provide a higher order of programmability the fuses can be replaced by programmable logic elements, such as logic-controllable passgates. In other words, it is contemplated that a reprogrammable or variably programmable embodiment can be constructed which can be digitally controlled during operation, such as by a central processing unit (CPU). The structure and operation of such elements are well known in the art; therefore, a detailed description is not necessary to an understanding of the invention.

A detailed logic gate circuit schematic of the present invention is shown in FIG. 4. For the purpose of describing the invention, an exemplary embodiment with a programmability of four possible states, requiring two fuses, is described. For more complicated input requirements, the number of fuses would be $2^n$, where n=number of possible states.

As an example of types of input signals which are common to registered memory-type integrated circuits, this embodiment is described with respect to using two architecture fuses to program an input pin for the ENABLE and INITIALIZE signals in synchronous or asynchronous input functionality, viz., four possible states. An ENABLE signal may be desirable to provide a word depth expansion function; an INITIALIZE signal may be desirable during a power up or reset operation. A truth table describing the two-bit architecture programming is shown in FIG. 5.

The circuit implementation of the present invention, as shown in FIG. 4, comprises common logic gates and flip-flop registers. As will be obvious to a person skilled in the art, therefore, the invention can be implemented in any semiconductor technology, e.g., bipolar, MOS, BiMOS, GaAs, etc.

Referring now to FIG. 4, programming circuitry 8 is used to preprogram the input pin 4 by setting the condition of architecture fuses F1' and F2'. Thereafter, decoder 10 will provide only one enabling signal on one of the decoder outputs DI1–DI4. In other words, the decoder acts as the truth table implementation, selecting which of the logic blocks 16, 18, 20, 22 is to be enabled, based upon the condition of the fuses F1', F2'. Fuse F3' is a data fuse for controlling the initialization state of the data register.

Figures 5, 6:
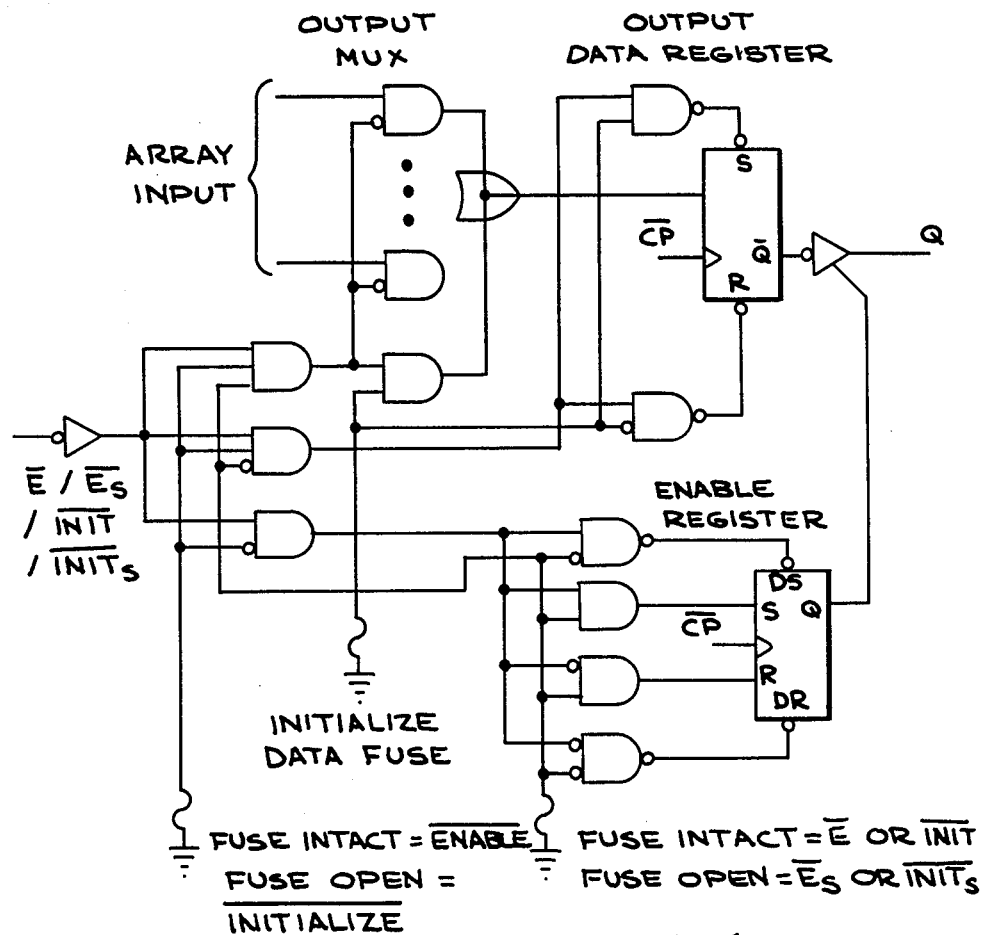
FIG. 5 is a truth table for operational modes of the embodiment of FIG. 4.
FIG. 6 is an alternative embodiment of the exemplary implementation of FIG. 4 with gate minimization.

For example, based on the logic of FIG. 4 and as shown in the truth table of FIG. 5, with the two architecture fuses F1, F2 intact, both the ENABLE and INITIALIZE functions will operate ASYNCHRONOUSLY because only one AND gate, G3, of the decoder 10 is active. Thus, only decoder output line D13 has an active signal to provide an input to one of the four logic blocks 16, 18, 20, 22—in this example, the selected logic block being the ASYNCHRONOUS ENABLE LOGIC block 20 which gets its other input directly from the input pin 4 (as would each of the logic blocks 16, 18, 20, 22, if so selected). Logic blocks for generating a digital signal level based upon input conditions are common logic gate implementation and well known in the art, and no detailed description is provided herein.

Thus, by severing selected fuses only, the user can program the input pin 4 to select only one of the input logic circuits, /INIT 16, /INITs 18, /ENABLE 20, /ENABLEs 22, when a LOW, or "0" is put on pin 4. In effect, the decoder outputs tell which of the logic blocks 16, 18, 20, 22 is activated.

As will be recognized by a person skilled in the art, without such programmability, to provide the possibility of having all such signals available, four inputs would be required.

Furthermore, using gate minimization design, the embodiment as shown in FIG. 4 can be reduced in size as shown in FIG. 6.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. It is possible that the invention may be practiced in other technologies, such as with other MOS or even bipolar processes. The scope of the invention can be defined by the claims appended hereto and their equivalents.

What is claimed is:

1. A programmable input circuit for an integrated circuit chip, comprising:
   (a) a plurality of digital logic circuits, each having:
      (1) an output connected to a function circuit on said chip to provide a binary signal outptut;
      (2) a first input terminal coupled to a circuit input terminal; and
      (3) a second input terminal;
   (b) a plurality of decoder means, each having an output connected to said second input terminal of said digital logic circuits; and each having input means; and
   (c) programmable means connected to each of said input means on each of said decoder means for providing an input signal to said decoder means, which signal is indicative of said digital logic means to be selected.

2. The circuit as set forth in claim 1, wherein said programmable means comprises:
   fuses, the conductive or nonconductive condition of which program said decoder means.

3. The circuit as set forth in claim 2, wherein said input circuit further comprises:
   n fuses; and
   N input circuit means, where $N=2^n$.

4. The circuit as set forth in claim 1, wherein said programmable means comprises:
   pass-gate circuitry, the ON-OFF condition of said pass-gates determining said programming of said decoder means.

5. A programmable input pin scheme for a circuit, comprising:
   a plurality, N, of circuit means, each having a first input discretely coupled to said input pin and each having an output coupled to an input terminal of said circuit, for selectively providing a signal to said input of said circuit; and
   N decoder circuit means having n programmable input means, where $N=2^n$, each of said programmable input means having an input coupled to a reference potential, and N outputs discretely coupled to second inputs of said circuit means, such that whether the reference potential signal level condition of said input means is high or low, depending upon the conductive state of said programmble input means, is decoded by said decoder means, enabling only one of said circuit means.

6. The input pin scheme as set forth in claim 5, wherein said n programmable input means comprise fused couplings between said reference potential and said decoder means.

7. The input scheme as set forth in claim 5, wherein said n programmable input means comprise pass-gate circuits for selectively coupling said reference potential to a selected one of said decoder means.

8. The input pin scheme as set forth in claim 5, wherein said decoder means comprises:
logic gate circuitry for decoding the reference potential signal level condition of said input means.

9. Circuitry for programming an input pin of an integrated circuit chip for multifunctional operational modes, comprising:
   a plurality, N, of discrete digital logic circuits, each having a first input discretely coupled to said input pin and each having an output coupled to an input terminal of said integrated circuit, for providing a digital logic signal to said input terminal of said integrated circuit; and
   N decoder circuits having n programmable input means, coupling said decoder circuits to a reference potential, and having N outputs discretely coupled to second inputs of said digital logic circuits, such that the condition of said input means is decoded by said decoder circuits, enabling only one of said digital logic circuits, and wherein $N=2^n$.

10. The circuitry as set forth in claim 9, wherein said programmable input means comprise fuses.

11. The circuitry as set forth in claim 9, wherein said programmable input means comprise programmable passgate circuitry.

12. For use in an integrated circuit chip, a method for providing multifunctionality to an input pin to select one of a plurality of digital system input signals to be input into said system, comprising:
   providing a plurality of selectable discrete digital logic signals acting as said digital system input signals, each of said signals requiring at least two input signals before transmitting said digital system input signal to said system;
   providing a first digital enabling signal as one of said input signals from said input pin; and
   providing a second digital signal as the second of said input signals from an on-chip circuit which is pre-programmable as to which of said second inputs receives said second digital signal, whereby said input pin is programmable to select only one of said plurality of said digital signals by programming said on-chip circuit.

13. In an integrated circuit chip, circuitry for programming an input pin to multifunctional operation modes, comprising:
   a plurality, N, of discrete digital logic circuits, each having a first input discretely coupled to said input pin and each having an output coupled to an input terminal of said integrated circuit, for providing a digital logic signal to said input terminal of said integrated circuit; and
   a plurality, N, of decoder circuits having n programmable input means coupling said decoder circuits to a reference potential, and having N outputs discretely coupled to second inputs of said digital logic circuits, such that the condition of said input means is decoded by said decoder circuits, enabling only one of said digital logic circuits, and wherein $N=2^n$.

14. The circuitry as set forth in claim 13, wherein said programmable input means comprise fuses.

15. The circuitry as set forth in claim 13, wherein said programmable input means comprise programmable passgate circuitry.

* * * * *